(12) United States Patent
Davis et al.

(10) Patent No.: US 10,841,706 B2
(45) Date of Patent: Nov. 17, 2020

(54) SPEAKER APPARATUS HAVING A HEAT DISSIPATION STRUCTURE INCLUDING AN ACTIVE ELEMENT

(71) Applicant: NOKIA TECHNOLOGIES OY, Espoo (FI)

(72) Inventors: Ian Davis, Delgany (IE); Rudi O'Reilly Meehan, Dublin (IE); Akshat Agarwal, Donate (IE)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 15/895,441

(22) Filed: Feb. 13, 2018

(65) Prior Publication Data

US 2019/0253804 A1    Aug. 15, 2019

(51) Int. Cl.
*H04R 9/02* (2006.01)
*H05K 7/20* (2006.01)
*H04R 1/28* (2006.01)

(52) U.S. Cl.
CPC ......... *H04R 9/022* (2013.01); *H05K 7/20145* (2013.01); *H05K 7/20154* (2013.01);
(Continued)

(58) Field of Classification Search
CPC .......... H04R 1/023; H04R 1/28; H04R 9/022; H04R 1/2876
(Continued)

(56) References Cited

U.S. PATENT DOCUMENTS 4,138,593 A    2/1979   Hasselbach et al.
4,210,778 A    7/1980   Sakurai et al.
(Continued)

FOREIGN PATENT DOCUMENTS

CN    203149475 U    8/2013
CN    106482562 A    3/2017
(Continued)

OTHER PUBLICATIONS

Lu, T.J. et al., "Sounds absorption of cellular metals with semiopen cells", The Journal of the Acoustical Society of America, vol. 108(4) (Oct. 2000) pp. 1697-1709.
(Continued)

*Primary Examiner* — Alexander Krzystan
(74) *Attorney, Agent, or Firm* — Alston & Bird LLP (57) ABSTRACT

A speaker apparatus is provided in order to both receive and dissipate heat and to provide acoustic absorption for sound waves propagating through a speaker cavity. The speaker apparatus includes a speaker and a speaker cavity configured to receive sound waves emitted by the speaker for propagation through the speaker cavity. The speaker apparatus also includes a heat dissipation structure disposed at least partially within the speaker cavity. The heat dissipation structure includes a thermally conductive mesh that at least partially fills the speaker cavity. The heat dissipation structure further includes an active element configured to direct heat generated by a component into the thermally conductive mesh for dissipation therein. The thermally conductive mesh is configured to provide acoustic absorption for the sound waves propagating through the speaker cavity.

16 Claims, 2 Drawing Sheets

(52) U.S. Cl.
CPC ..... *H05K 7/20263* (2013.01); *H05K 7/20272* (2013.01); *H04R 1/288* (2013.01); *H04R 2499/11* (2013.01)

(58) Field of Classification Search
USPC ........ 381/397, 348, 337, 346, 353, 354, 391
See application file for complete search history.

(56) References Cited

U.S. PATENT DOCUMENTS

| | | | |
|---|---|---|---|
| 5,560,362 | A | 10/1996 | Sliwa, Jr. et al. |
| 7,181,039 | B2 | 2/2007 | Stiles et al. |
| 7,801,320 | B2 | 9/2010 | Mellow |
| 8,292,023 | B2 | 10/2012 | Slotte |
| 8,561,756 | B2 | 10/2013 | Litovsky et al. |
| 8,630,435 | B2 | 1/2014 | Mellow et al. |
| 9,092,204 | B2 | 7/2015 | Chou et al. |
| 9,648,403 | B2 | 5/2017 | Papakyriacou et al. |
| 2002/0057811 | A1* | 5/2002 | Burleson ................. H04R 9/022 381/165 |
| 2003/0098230 | A1* | 5/2003 | Carlow ................. B01D 53/323 204/164 |
| 2008/0106171 | A1 | 5/2008 | Mongia |
| 2008/0188755 | A1 | 8/2008 | Hart |
| 2009/0321053 | A1* | 12/2009 | Tegrotenhuis .......... F25B 37/00 165/104.26 |
| 2013/0312429 | A1 | 11/2013 | Greuet et al. |
| 2016/0120019 | A1* | 4/2016 | Shedd .................. H05K 1/0204 361/679.47 |
| 2016/0212543 | A1 | 7/2016 | Kochendoerfer et al. |
| 2016/0345090 | A1* | 11/2016 | Wilk ...................... B01D 53/04 |
| 2017/0353785 | A1 | 12/2017 | Choi et al. |
| 2018/0152790 | A1* | 5/2018 | Dong ....................... H04R 9/06 |
| 2019/0153977 | A1* | 5/2019 | Hutchins .................. F02G 5/04 |

FOREIGN PATENT DOCUMENTS

| | | | |
|---|---|---|---|
| CN | 108238775 | A * | 7/2018 |
| CN | 108238775 | A | 7/2018 |
| JP | 2004 274383 | A | 9/2004 |
| KR | 101756673 | B1 | 7/2017 |
| WO | WO 2014118623 | A2 | 8/2014 |

OTHER PUBLICATIONS

Zarid, Z et al., TACS: "Thermo Acoustic Cooling System", World Academy of Science, Engineering and Technology International Journal of Environmental and Ecological Engineering, vol. 7, No. 8 (2013) pp. 539-543.

Dual Cool Jets (Brochure) [online] [retrieved Mar. 9, 2018]. Retrieved from the Internet: <URL: https://www.aavid.com/sites/default/files/products/pulse-jets/dual-cool-jet-specification.pdf>. (undated) 1 page.

Benschop, J., How to Design Enclosures for Heat Dissipation [online] [retrieved Mar. 16, 2018]. Retrieved from the Internet :< URL: https://itstillworks.com/design-enclosures-heat-dissipation-12019985.html>. (undated) 2 pages.

International Search Report and Written Opinion for Application No. PCT/FI2019/050074 dated Apr. 24, 2019, 15 pages.

International Search Report and Written Opinion for Application No. PCT/FI2019/050075 dated Apr. 24, 2019, 14 pages.

Hokmark, B., *Acoustic Analysis of Loudspeakers Cavity Including Viscothermal Effects*, Master's Dissertation, Lund University (2006) 30 pages.

Nijhof, M., *Viscothermal Wave Propagation*, (Nov. 2010) 348 pages.

Office Action for U.S. Appl. No. 15/895,382 dated Mar. 27, 2019.

Notice of Allowance for U.S. Appl. No. 15/895,382 dated Oct. 3, 2019.

* cited by examiner

SPEAKER APPARATUS HAVING A HEAT DISSIPATION STRUCTURE INCLUDING AN ACTIVE ELEMENT

TECHNOLOGICAL FIELD

An example embodiment relates generally to a speaker apparatus and, more particularly, to a speaker apparatus that includes a heat dissipation structure that is disposed at least partially within a speaker cavity and that includes an active element configured to direct heat into the speaker cavity.

BACKGROUND

Loudspeakers, or speakers, are included in a wide variety of devices. For example, telecommunications devices, such as mobile telephones or smartphones, include speakers for audio communication as well as for video and audio media playback.

In free space, the soundwaves emitted by the different sides of the speaker, such as the front and the back of the speaker, will interact and cause undesired cancellation affects. In order to reduce the undesired cancellation affects, speakers are generally placed within an enclosure that defines a speaker cavity to the rear of the speaker filled with, for example, air.

While placement of the speaker within an enclosure mitigates the undesired cancellation affects, the enclosure and, more particularly, the speaker cavity defined by the enclosure may create other issues. In this regard, the air within the speaker cavity acts as a spring having a stiffness proportional to the volume of the speaker cavity. A small speaker cavity has a high stiffness and will therefore impede the motion of the speaker membrane. The impedance of the speaker membrane reduces the efficiency of the speaker, particularly at low frequencies. While larger speaker cavities do not impede the motion of the speaker membrane to as great of a degree, many devices including telecommunication devices, such as mobile telephones, hands free communication devices and laptop and tablet computers, have only limited space available for the speaker such that the enclosure and the resulting speaker cavity must be relatively small. As a result, the speakers housed by such relatively small enclosures may provide sub-optimal sound quality including, for example, the "tinny" sound provided by some speakers disposed within small enclosures.

The challenges associated with the dedication of a sufficient volume within a device for a speaker cavity may be further complicated by the electronic components that are also included within the device, such as a telecommunications device, that includes a speaker. At least some of the components, such as central processing units, graphical processing units, optical modules or the like, have a relatively large heat flux and therefore generate substantial heat while in use. In order remove the heat and ensure that the components remain at a temperature that permits the components to operate properly, conductive or multiphase thermal paths may be provided between the components that serve as the sources of heat and the surrounding environment. However, these thermal paths also have volumetric requirements and restrictions in terms of their proximity to other components that are temperature-sensitive.

Thus, the allocation of the volume within a device, such as a telecommunications device, that includes a speaker must take into account a number of competing considerations including the size of the speaker cavity and the necessity for thermal paths to dissipate heat generated by various components of the device. This design challenge has generally increased over time as improvements in the performance of the devices has typically led to an increase in the heat flux generated by the components of the device that must be dissipated. Moreover, the desire for further miniaturization of the devices, such as telecommunications devices, has imposed increasingly stringent restrictions on the volume available for heat dissipation, speaker cavities and the like.

In an effort to improve the performance of speakers, alternative enclosures for speakers have been considered. For example, ported enclosures have been designed that define a small vent attached to a relatively short waveguide. The vent changes the acoustic characteristics of the enclosure from a sealed box to a Helmholtz resonator. The air inside the relatively small waveguide and the speaker cavity acts as a mass-spring system, which has a different reactance than that provided by a sealed speaker cavity. This change in reactance can lead to enhanced speaker efficiency at low frequencies. Similarly, transmission line enclosures, quarter wavelength enclosures and passive radiators have been developed that also change the acoustic performance of a speaker. Further, enclosures have been designed in which the volume provided by the speaker cavity is filled with a material to lower the characteristic speed of sound within the speaker cavity, thereby increasing the effective volume of the speaker enclosure and reducing the impedance to the speaker motion. However, these alternative enclosure designs have increased complexity and, as a result, may be more challenging and expensive to manufacture, particularly for small devices.

BRIEF SUMMARY

A speaker apparatus is provided in accordance with an example embodiment in order to both receive and dissipate heat and to provide acoustic absorption for sound waves propagating through a speaker cavity. In this regard, the speaker apparatus may include a heat dissipation structure disposed at least partially within the speaker cavity. The heat dissipation structure includes an active element to direct heat generated by a component, such as a component associated with the speaker apparatus, to the speaker cavity in which the heat is dissipated, thereby providing for improved performance by the component that generates heat. By providing acoustic absorption, the heat dissipation structure increases the effective air volume of the speaker cavity and reduces the impedance to speaker motion, thereby providing for improved speaker performance. By providing for both heat dissipation and acoustic absorption by a heat dissipation structure disposed at least partially within the speaker cavity, the speaker apparatus of an example embodiment may address these competing concerns and provide for improved speaker performance in devices, including relatively small devices having a limited volume available for a speaker cavity and for the thermal paths necessary for heat dissipation.

In one embodiment, a speaker apparatus is provided that includes a speaker and a speaker cavity configured to receive sound waves emitted by the speaker for propagation through the speaker cavity. The speaker apparatus also includes a heat dissipation structure disposed at least partially within the speaker cavity. The heat dissipation structure includes a thermally conductive mesh that at least partially fills the speaker cavity. The heat dissipation structure further includes an active element configured to direct heat generated by a component into the thermally conductive mesh for dissipation therein. The thermally conductive mesh is configured to provide acoustic absorption for the sound waves propagating through the speaker cavity.

The active element of an example embodiment is a fan configured to direct air into the speaker cavity. In this example embodiment, the heat dissipation structure may also include a graded mesh in thermal communication with the component that generates heat. The graded mesh is positioned between the fan and the thermally conductive mesh. The graded mesh has a density that is graded so as to increase from the side facing the fan to the side facing the thermally conductive mesh. In the embodiment in which the active element is a fan, the heat dissipation structure may also or alternatively include a plurality of baffles positioned between the fan and the thermally conductive mesh so as to redirect at least a portion of the air directed by the fan into the speaker cavity.

The heat dissipation structure of another example embodiment also includes a flow loop extending between a first section in thermal communication with the component that generates heat and a second section disposed within the thermally conductive mesh. In this example embodiment, the active element includes a pump configured to pump liquid through the flow loop. The flow loop of this example embodiment may include a serpentine section within the thermally conductive mesh.

In another example embodiment, a speaker apparatus is provided that includes a speaker and a speaker cavity configured to receive sound waves emitted by the speaker for propagation through the speaker cavity. The speaker apparatus also includes a heat dissipation structure disposed at least partially within the speaker cavity. The heat dissipation structure includes a thermally conductive mesh that at least partially fills the speaker cavity. The heat dissipation structure further includes a fan configured to force air to direct heat generated by a component into the thermally conductive mesh for dissipation therein. The thermally conductive mesh is configured to provide acoustic absorption for the sound waves propagating through the speaker cavity.

The heat dissipation structure of an example embodiment also includes a graded mesh in thermal communication with the component that generates heat. The graded mesh is positioned between the fan and the thermally conductive mesh. The graded mesh of an example embodiment has a density that is graded so as to increase from a side facing the fan to a side facing the thermally conductive mesh. The heat dissipation structure of an example embodiment also includes a thermal interface material between the graded mesh and the component that generates heat. The heat dissipation structure of an example embodiment also or alternatively includes a plurality of baffles positioned between the fan and the thermally conductive mesh so as to redirect at least a portion of the air forced by the fan into the speaker cavity. The thermally conductive mesh of an example embodiment is formed of a plurality of layers of an additively manufactured metal.

In a further example embodiment, a speaker apparatus is provided that includes a speaker and a speaker cavity configured to receive sound waves emitted by the speaker for propagation through the speaker cavity. The speaker apparatus also includes a heat dissipation structure disposed at least partially within the speaker cavity. The heat dissipation structure includes a thermally conductive mesh that at least partially fills the speaker cavity. The heat dissipation structure also includes a flow loop extending between a first section in thermal communication with the component that generates heat and a second section disposed within the thermally conductive mesh. The heat dissipation structure further includes a pump configured to pump liquid through the flow loop in order to dissipate heat generated by the component into the thermally conductive mesh. The thermally conductive mesh is configured to provide acoustic absorption for the sound wave propagating through the speaker cavity.

The second section of the flow loop of an example embodiment has a serpentine shape and is disposed within the thermally conductive mesh. Additionally or alternatively, the first section of the flow loop of an example embodiment has a serpentine shape and is in thermal communication with the component that generates heat. The flow loop of an example embodiment defines a first flow loop to dissipate heat generated by a first component. The heat dissipation structure of this example embodiment may also include a second flow loop extending between a first section in thermal communication with a second component that generates heat and a second section disposed within the thermally conductive mesh in order to dissipate heat generated by the second component into the thermally conductive mesh. The heat dissipation structure including the first and second flow loops is configured in accordance with an example embodiment to maintain the first and second components in accordance with different operating temperature constraints. The thermally conductive mesh of an example embodiment is formed of a plurality of layers of an additively manufactured metal, such as aluminum.

BRIEF DESCRIPTION OF THE FIGURES

Having thus described certain example embodiments of the present disclosure in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

Figure 1:
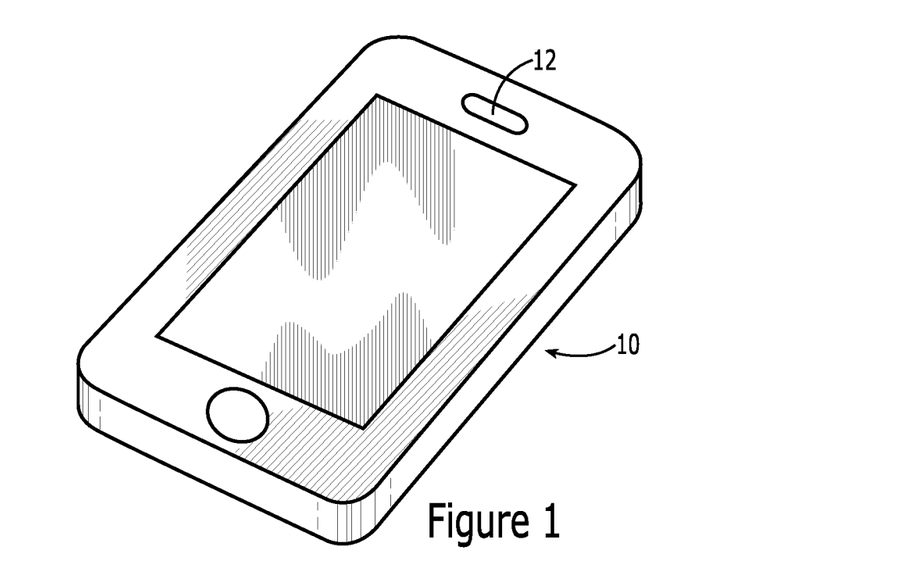
FIG. 1 is a perspective view of an electronic device including one or more speakers.

A wide variety of electronic devices include one or more speakers for supporting voice communications, video playback, audio playback or for other purposes. The electronic devices that include speakers include various telecommunications devices, such as a mobile telephone 10 as shown in FIG. 1, as well as other electronic devices, such as a tablet computer, a portable computer, a gaming system, a personal navigation system, hands free communication devices, audio and/or video system or the like. A number of the electronic devices that include speakers 12 are relatively small and the design objective for a number of the electronic devices having speakers including, for example, telecommunications devices, such the mobile telephone of FIG. 1, is to further miniaturize the devices. Further reductions in size increase the challenges associated with providing speakers that perform as desired while concurrently dissipating the heat generated by components of the electronic device to ensure continued, reliable performance of the electronic device by maintaining the temperature of the components within an acceptable operating temperature range.

In order to address the competing objectives of a speaker cavity having a sufficient volume to permit proper speaker operation and the dissipation of the heat generated by components associated with the electronic device in a manner that does not negatively impact other thermally sensitive components of the device, a speaker apparatus is provided in accordance with an example embodiment that includes a heat dissipation structure disposed at least partially within the speaker cavity. The speaker apparatus may be configured in various manners. For example, the speaker apparatus may be a combined module including both a speaker 22, that is, a transducer, and a speaker enclosure 20 that is physically integrated with the speaker and that defines a speaker cavity 24. Alternatively, the speaker apparatus may include a speaker and a speaker enclosure that is separate from the speaker, but acoustically and/or mechanically coupled thereto. Still further, the speaker apparatus may include the speaker enclosure that defines the speaker cavity for receiving sound waves from a speaker that is acoustically and/or mechanically coupled to the speaker enclosure. In the foregoing embodiments in which the speaker apparatus includes a speaker enclosure 20, the speaker enclosure defines a speaker cavity configured to receive sound waves emitted by a speaker for propagation through the speaker cavity. The speaker enclosure of one embodiment may be comprised of a dedicated housing as illustrated herein. Alternatively, the speaker enclosure may be formed by the interior air volume of the electronic device, such as a mobile telephone, a tablet or portable computer or the like with the housing of the electronic device forming the boundaries of the speaker enclosure as well as encompassing other components of the electronic device. In any of the foregoing embodiments, the speaker enclosure may be fully sealed or may be substantially sealed. In an instance in which the speaker enclosure is substantially sealed, the speaker enclosure may define a leak hole or a leak aperture. In some other embodiments in which the speaker enclosure is ported (or apertured), the mesh described below may extend into the volume defined by the port or aperture.

Figure 2:
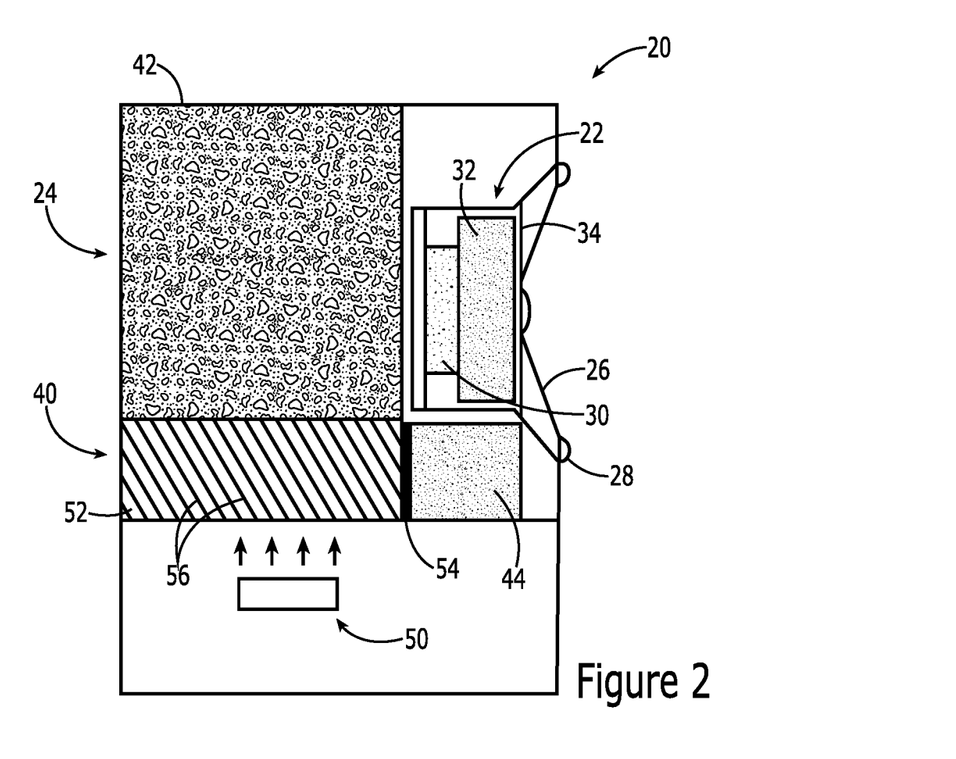
FIG. 2 is a cross-sectional view of a speaker apparatus having a heat dissipation structure that includes a fan configured to force air into a thermally conductive mesh that at least partially fills a speaker cavity in accordance with an example embodiment of the present disclosure.
Figures 3, 4:
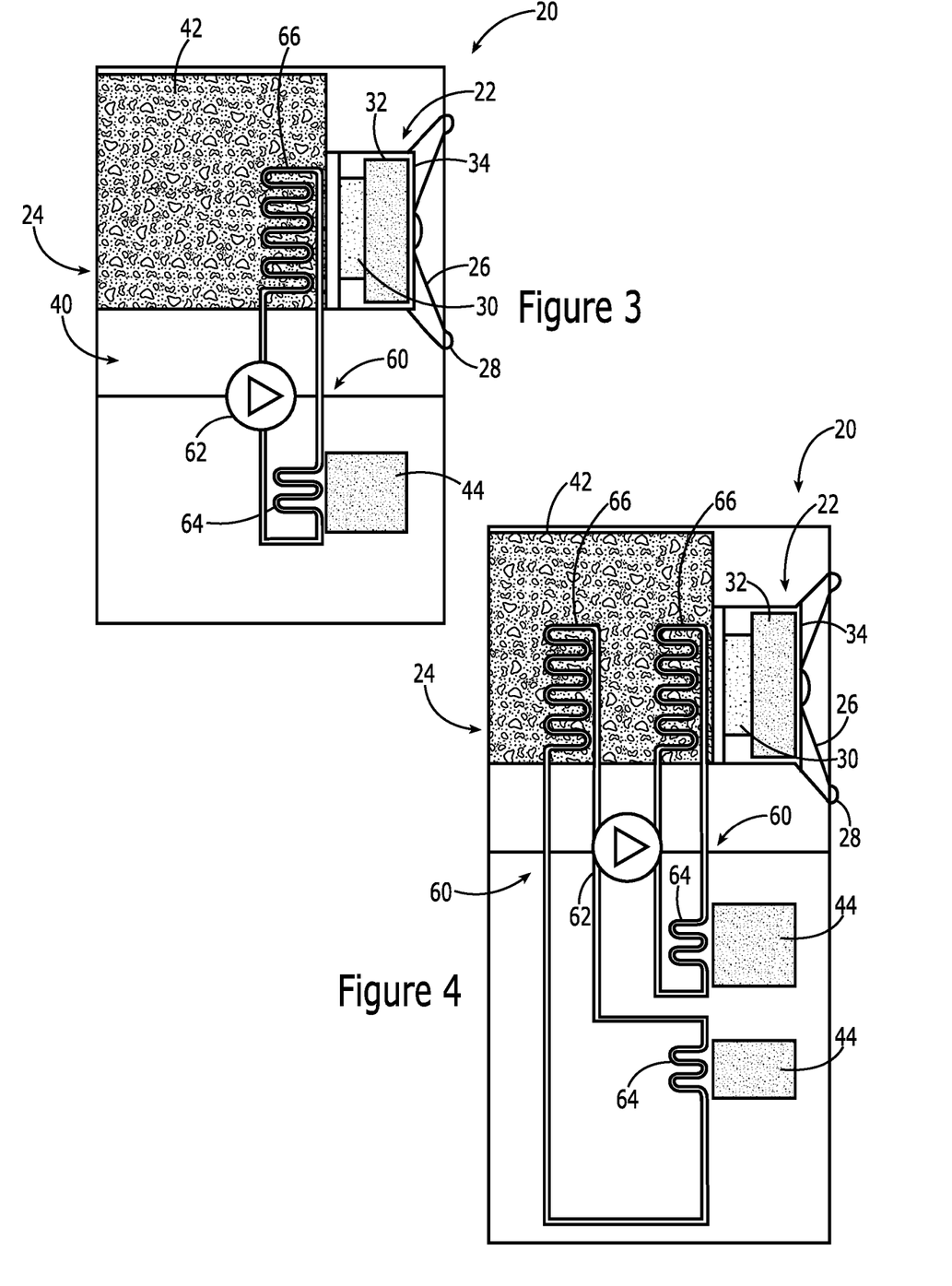
FIG. 3 is a cross-sectional view of a speaker apparatus having a heat dissipation structure that includes a pump configured to pump liquid through a flow loop in order to transfer heat generated by a component into a thermally conductive mesh that at least partially fills a speaker cavity in accordance with an example embodiment of the present disclosure.
FIG. 4 is a cross-sectional view of a speaker apparatus that includes a heat dissipation structure having first and second flow loops configured to transfer heat generated by first and second components, respectively, into a thermally conductive mesh that at least partially fills a speaker cavity in accordance with an example embodiment of the present disclosure.

The speaker 22 may be assembled with the speaker enclosure 20 so as to form a speaker module. Alternatively, the speaker may be separated from the speaker enclosure, but acoustically and/or mechanically coupled to the speaker enclosure. Although the speaker may be configured in various manners, the speaker of one example embodiment is depicted in FIGS. 2, 3 and 4 to be disposed within an opening defined by a speaker enclosure. The speaker includes a diaphragm 26 that extends over the opening and may be secured or sealed to the enclosure by a gasket 28 that extends about the opening. The speaker of this example embodiment also includes a magnet 30 and an overlying pole piece 32. The speaker of this example embodiment further includes a spider 34 that extends across the opening defined by the speaker enclosure between the pole piece and the diaphragm. As shown, the diaphragm may be secured to a medial portion of the spider in order to move therewith in order to generate sound waves upon operation of the speaker.

The sound waves not only propagate outwardly from the speaker 22 into the surrounding environment, such as in a direction extending to the right in the cross-sectional view of FIGS. 2, 3 and 4, but also to the rear of the speaker, such as to the left in the cross-sectional view of FIGS. 2, 3 and 4. In order to reduce the effect of the sound waves propagating to the rear of the speaker and to avoid destructive interference with the sound waves propagating in other directions from the speaker, the speaker enclosure 20, defines a speaker cavity 24. The speaker cavity is configured to receive sound waves emitted by the speaker with the sound waves propagating through the speaker cavity. As shown in FIGS. 2, 3 and 4, the speaker cavity is a back cavity that is generally disposed rearward of the speaker, such as on the opposite side of the speaker from the diaphragm 26. However, the speaker cavity of other embodiments may be positioned differently relative to the speaker and, in one embodiment, is a front cavity so as to be positioned forward of the speaker.

In accordance with an example embodiment, the speaker apparatus further includes a heat dissipation structure 40 disposed at least partially and, in some embodiments, completely, within the speaker cavity 24. As described below, the heat dissipation structure may be configured in various manners, but generally includes a thermally conductive mesh 42 that at least partially and, in some embodiments, completely fills the speaker cavity. The thermally conductive mesh may be formed of various materials including, for example, aluminum. In one embodiment, for example, the thermally conductive mesh is formed of a plurality of layers of an additively manufactured metal. The mesh of an example embodiment provides for thermal dissipation, but does not adversely impact sound propagation in any noticeable manner. In this regard, the porosity of the mesh may be quite high, such as 90% or greater. As such, the acoustic impedance of the mesh may approach the acoustic impedance of air and, in some embodiments, the mesh is acoustically transparent, thereby ensuring that sound or at least an appreciable amount of sound is not reflected by the mesh. In other embodiments in which the mesh is to absorb some of the sound, the pore size of the mesh is much smaller, such as less than 1 millimeter. The mesh may therefore be configured to have different degrees of acoustical transparency. As such, the size and/or shape of the mesh may be defined or tuned, and/or the size or dimensions of the pores may be defined or tuned, such as to control the thermal dissipation and/or the acoustic impedance. Further details regarding sound absorption characteristics for meshes including analytical predictions for absorption by a cellular metal material are provided by an article entitled "Sound absorption of cellular metals with semiopen cells" by Lu, et al. as published in the The Journal of the Acoustical Society of America (November 2000). The mesh may define irregular air channels therethrough. Alternatively, the mesh may define uniform apertures including air channels of uniform dimensions, angles, etc. In either instance, the mesh is considered to be a porous mesh.

The heat dissipation structure 40 also includes an active element configured to direct heat generated by a component 44, such as a component associated with the speaker apparatus, e.g., a component fully or partially disposed within the speaker enclosure 20, into the thermally conductive mesh 42 for dissipation therein. A variety of different types of components of an electronic device 10 generate heat. For example, a central processing unit, a graphical processing unit, an integrated circuit including an application specific integrated circuit, an optical module, a light emitting diode, a battery, a motherboard, a memory device such as a random access memory as well as other types of components generate heat that is advantageously dissipated in a controlled fashion such that the components remain within a desired operating temperature range to ensure their continued, reliable operation without undesirably increasing the temperature of any other temperature sensitive component(s) within the electronic device. The heat generated by the component that is directed by the active element into the speaker cavity 24 may emanate directly from the component or may be provided by a thermal path that extends from the component, such as a component that is located remote relative to the speaker apparatus.

In addition to providing for dissipation of heat, the thermally conductive mesh 42 is also configured to provide acoustic absorption for sound waves output by the speaker 22 that are propagating through the speaker cavity 24. By providing for acoustic absorption, the thermally conductive mesh changes, that is, reduces, the local speed of sound propagating through the speaker cavity and correspondingly increases the effective size of the speaker cavity, thereby reducing the impedance to vibration of the diaphragm, particularly at lower frequencies, and facilitating improved acoustic performance of the speaker.

The active element may be configured in various manners. In one embodiment depicted in FIG. 2, the active element is a fan 50 or other type of air mover (hereinafter generally referenced as a fan) configured to direct air into the speaker cavity 24. Although the fan may be disposed within the speaker cavity, the fan of an example embodiment is disposed outside of the speaker cavity but in fluid communication therewith such that the air directed by the fan flows into the speaker cavity. Various fans may be utilized as the active element including, for example, a diaphragm cooler, such as a dual cool jet provided by Aavid Corporation, or a piezo fan, such as described by International Patent Application Publication No. WO 2014118623 filed Jan. 13, 2014 and naming Brian Donnelly, et al. as inventors. The fan may be configured to be activated all of the time that the electronic device 10 incorporating the speaker apparatus is in operation. Alternatively, the fan could be controlled, such as by a processor onboard the electronic device based upon the temperature of one or more components of the electronic device, so as to be selectively activated when component(s) become hot. For example, the processor could be configured to receive temperature measurements from one or more components on board the electronic device and to activate the fan in an instance in which the measured temperature exceeds a predetermined threshold, thereby providing the desired heat dissipation while preserving battery life and/or efficiency.

Dissipation of the heat generated by the component 44 is provided in accordance with the embodiment of FIG. 2 by conduction through the speaker cavity 24, such as through the thermally conductive mesh 42 that at least partially fills the speaker cavity and also by forced convection from the fan 50. By cooling the air within the speaker apparatus, such as within the speaker enclosure 20, as a result of the air flow through the speaker cavity, the speed of sound within the speaker cavity, which is proportional to the square root of the temperature of the air within the speaker cavity, may be reduced in order to improve the acoustic performance of the speaker. However, unimpeded air flow through the mesh may also create some disadvantageous from an acoustic standpoint. However, this potentially deleterious impact upon acoustic performance may be addressed by not permitting the air directed by the fan to flow directly and unimpeded through the speaker cavity, but, instead, to redirect the air flow prior to entry into the speaker cavity.

In this regard, the heat dissipation structure 40 of an example embodiment also includes a graded mesh 52 positioned between the fan 50 and the thermally conductive mesh 42. The graded mesh may be formed of the same thermally conductive material as the mesh that at least partially fills the speaker cavity, such as aluminum. Alternatively, the graded mesh may be formed of a different thermally conductive material. The graded mesh has a density that is graded so as to increase from a lower density on the side facing the fan to a higher density on side facing the thermally conductive mesh. The graded mesh may have a density that is graded in various manners, such as linearly with the density linearly increasing from the side facing the fan to the side facing the thermally connected mesh. Alternatively, the density of the graded mesh may increase in a step-wise manner from the side facing the fan to the side facing the thermally connected mesh. In an embodiment in which the density of the graded mesh is graded in a step-wise manner, the graded mesh may be comprised of a plurality of layers of mesh, each layer having a different density and the layers being formed such that the density of the layers increases from the side facing the fan to the side facing the thermally conductive mesh. In this embodiment, each of the layers are generally formed of the same thermally conductive material, such as aluminum. The grading ratio is dependent on the active element and balances the increased heat dissipation provided by a denser mesh relative to the increased power demands of an active element, e.g., a fan 50, to overcome brought about by the higher pressure drop attributable to the denser mesh. In some embodiments, ratio of the density of the densest layers of the graded mesh to the density of the mesh should not exceed 2, as denser meshes will require a larger active element that consumes even more power.

The graded mesh 52 is in thermal communication with the component 44 that generates heat. In this regard, the graded mesh may be in direct thermal communication with the component that generates heat or may be in thermal communication with the thermal path via which heat from a more remote component propagates. In either scenario, the graded mesh is in thermal communication with and is configured to receive heat from the component. The heat received by the graded mesh may then be directed into the speaker cavity 24 and, more particularly, into the thermally conductive mesh 42 that at least partially fills the speaker cavity as a result of the airflow created by the fan 50 that is directed through the graded mesh and into the speaker cavity. In order to facilitate the heat transfer from the component (either directly or via a thermal path leading from the component) to the graded mesh, the heat dissipation structure may also include a thermal interface material 54, such as thermal grease or a liquid metal, positioned between the graded mesh and either the component that generates heat as shown in FIG. 2 or the thermal path leading from the component that generates heat. The thermal interface material facilitates that thermal transfer of heat generated by the component to the graded mesh in order to facilitate heat dissipation by the heat dissipation structure 40.

In an example embodiment, the heat dissipation structure 40 includes a plurality of baffles 56 positioned between the fan 50 and the thermally conductive mesh 42. The baffles may be formed of any rigid material and, in one embodiment, are formed of a thermally conductive rigid material, such as aluminum or copper, in order to also remove heat by conduction. In some embodiments, the plurality of baffles may be utilized independent of, that is, without the graded mesh 52. Alternatively, as shown in FIG. 2, the heat dissipation structure of some embodiments includes both the graded mesh and the plurality of baffles. In this embodiment, the plurality of baffles may be disposed within the graded mesh so as to extend at least partially therethrough. Alternatively, the plurality of baffles may be positioned outside of the graded mesh with the plurality of baffles positioned between the fan and the graded mesh or the graded mesh may be positioned between the fan and the plurality of baffles.

The plurality of baffles 56 generally extend at an acute angle relative to the direction of flow of the air forced by the fan 50 into the speaker cavity 24. For example, the plurality of baffles may be positioned at 45° relative to the direction of flow of the air exiting the fan. However, the baffles may be positioned at other angles in other embodiments. While the baffles are shown in cross section in FIG. 2, the plurality of baffles, like the graded mesh 52, generally extend across the entire opening into the speaker cavity. Further, the plurality of baffles are generally positioned such that neighboring baffles overlap. In this regard, each baffle generally extends from a first end to an opposed second end. By being overlapped, the second end of one baffle, that is, the end of the baffle that is closest to the speaker cavity or that extends furthest into the speaker cavity, overlaps with the first end of the neighboring baffle, that is, the end of the baffle that is closest to the fan. As such, all air that is directed by the fan into the speaker cavity intersects or is otherwise redirected by a baffle. Thus, the plurality of baffles redirect at least a portion of the air forced by the fan into the speaker cavity.

By including the graded mesh 52 and/or a plurality of baffles 56, the heat dissipation structure 40 of this example embodiment allows air forced by the fan 50 to flow into the speaker cavity 24 so as to interact with the thermally conductive mesh 42 in order to facilitate heat dissipation. However, the graded mesh and/or the plurality of baffles prevent the air forced by the fan from flowing directly and unimpeded into the speaker cavity and, instead, redirects the air flow such that the air that is forced into the speaker cavity does not impair the acoustic performance of the speaker 22.

The heat dissipation structure 40 may be configured in a variety of different manners. For example, FIG. 3 depicts another embodiment in which the heat dissipation structure not only includes a thermally conductive mesh 42 that at least partially fills the speaker cavity 24, but also includes a flow loop 60 extending between a component 44 that generates heat and the thermally conductive mesh. In this regard, the flow loop may extend proximate to the component that generates heat or proximate to the thermal path leading from the component that generates heat. In either instance, the flow loop is a closed loop that is in thermal communication with the component associated with the speaker housing that generates heat.

Liquid is pumped through the flow loop 60, such as by a fluidic pump 62. In one embodiment, the flow loop is a microfluidic flow loop that permits significant heat removal with a relatively small form factor. In a microfluidic flow loop, liquid, such as water, travels through a series of microchannels. As a result of the thermal communication between the flow loop and the component 44 that generates heat, such as due to the proximal relationship of a portion of the flow loop and the component that generates heat, the liquid, e.g., water, absorbs heat from the component and the portion of the flow loop that extends through the thermally conductive mesh 42 then dissipates this heat into the thermally conductive mesh that at least partially fills the speaker cavity 24 prior to being recirculated through the microfluidic flow loop and absorbing additional heat from the component. The mesh 42 and the microchannel placement may be configured to provide a desired visco-thermal loss. In this regard, viscothermal effects in acoustics are significant when the thermal and viscous penetration depths are of a significant size relative to the cross-sectional area of the on-coming sound wave. For example, sound propagating through submillimeter holes and slits is greatly attenuated by viscothermal losses. These penetration depths are dependent on properties of the fluid as well as being inversely proportional to the square root of frequency. Thus, penetration depths are larger at lower frequencies. As well as the size of the gap, the reactance of the volume between the inter-tube air gaps also affects the absorption response. This reactance is dictated by the spacing between the gap and the nearest reflecting surface in the direction that the wave propagates. The resulting reactance affects the absorption response of the gap as depending on the reactance, the frequency band of absorption may vary.

Various types of pumps 62 may be utilized to pump liquid through the flow loop 60. In one embodiment, a micropump such as described by International Patent Application Publication No. WO 2014118623 may be utilized. Notwithstanding the relatively small form factor of a micropump, such as about 1 cm$^3$ in one example embodiment, a micropump may operate in such a manner to dissipate more heat than that dissipated by air cooling. For example, a micropump operating at a maximum pressure of 190 kPa and a maximum flow rate of about 75 mL/min, in combination with a flow loop through which liquid circulates in order to absorb heat from the component 44 and to then reject the heat into the thermally conductive mesh 42 permits greater heat loads to be dissipated than those dissipated by air cooling.

In order to absorb more heat from the component 44, the flow loop 60 may include a serpentine section 64 having a plurality of loops in thermal communication with the component that generates heat. For example, the plurality of loops of the serpentine section of the flow loop may be disposed proximate to the component as shown in FIG. 3 Additionally or alternatively, in order to facilitate the dissipation of heat carried by the liquid circulating through the flow loop into the thermally conductive mesh 42, a portion of the flow loop that is disposed within the thermally conductive mesh may include a serpentine section 66 including a plurality of loops.

In an embodiment in which two or more components 44 generate heat, the flow loop 60 may be in thermal communication with each of the two or more components so as to absorb heat from each of the two or more components, either directly or via thermal paths from the two or more components, with the heat then being subsequently dissipated within the thermally conductive mesh 42 that at least partially fills the speaker cavity 24. In another embodiment depicted in FIG. 4, however, the heat dissipation structure 40 includes a plurality of flow loops, one of which is in thermal communication with a respective one or more of the components that generate heat. Each flow loop of this embodiment may be in thermal communication with different components as shown in FIG. 4 or two or more flow loops may be in thermal communication with one or more of the same components.

In the embodiment of FIG. 4 in which the speaker apparatus is associated with first and second components 44 that generate heat, the heat dissipation structure 40 may include first and second flow loops 60. The first flow loop is in thermal communication with the first component, either directly as shown as a result of the proximal relationship between the first flow loop and the first component or indirectly via a thermal path leading from the first component, in order to receive and, in turn, dissipate heat generated by the first component. Similarly, the second flow loop is in thermal communication with the second component, either directly as shown as a result of the proximal relationship between the second flow loop and the second component or indirectly via a thermal path leading from the second component, in order to receive and, in turn, dissipate heat generated by the second component. The inclusion of multiple flow loops may facilitate the dissipation of greater heat loads.

Additionally or alternatively, the inclusion of multiple flow loops 60 may permit the first and second components 44 to be maintained at different temperatures, such as by being maintained in accordance with different operating temperature constraints, such as within different operating temperature ranges. In this regard, the heat disposal from each of the first and second components may be differently controlled as a result of the absorption and dissipation of heat therefrom by the different flow loops.

The heat dissipation structure 40 that includes a plurality of flow loops 60 may include a single pump 62 for pumping liquid through each of the plurality of flow loops as shown in FIGS. 3 and 4. Alternatively, the heat dissipation structure may include a plurality of pumps, one of which is associated with each different flow loop for pumping liquid through the respective flow loop.

In an example embodiment, the mesh 42 may be additively manufactured from a metal and, in some embodiments, the entire speaker cavity 24 including the heat dissipation structure 40 may be additively manufactured from layers of a metal, such as aluminum, such as by use of a selective laser melting (SLM) printer. By additively manufacturing the speaker cavity and the components therein, control over the microstructure of the mesh is provided such that the porosity, resistivity, tortuosity, thermal and viscous characteristic lengths of the mesh may be controlled.

As described above, a speaker apparatus is provided in order to both receive and dissipate heat and to provide acoustic absorption for sound waves propagating through a speaker cavity 24. In this regard, the speaker apparatus may include a heat dissipation structure 40 that includes an active element to direct heat generated by a component 44 to the speaker cavity in which the heat is dissipated, thereby providing for improved performance by the component that generates heat. By providing acoustic absorption, the heat dissipation structure also increases the effective air volume of the speaker enclosure 20, and reduces the impedance to speaker motion, thereby providing for improved speaker performance. By providing for both heat dissipation and acoustic absorption by a heat dissipation structure disposed at least partially within the speaker cavity, the speaker apparatus of an example embodiment may address these competing concerns and provide for improved speaker performance in devices, including relatively small devices having a limited volume available for a speaker cavity and for the thermal paths necessary for heat dissipation.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed is:

1. A speaker apparatus comprising:
a speaker;
a speaker cavity configured to receive sound waves emitted by the speaker for propagation through the speaker cavity; and
a heat dissipation structure disposed at least partially within the speaker cavity, wherein the heat dissipation structure comprises a thermally conductive mesh that at least partially fills the speaker cavity, and wherein the heat dissipation structure further comprises an active element configured to direct heat generated by a component into the thermally conductive mesh for dissipation therein, and wherein the thermally conductive mesh is configured to provide acoustic absorption for the sound waves propagating through the speaker cavity,
wherein the heat dissipation structure further comprises another mesh and a plurality of thermally conductive rigid elements disposed within the another mesh, wherein the another mesh is positioned between the active element and the thermally conductive mesh so as to redirect at least a portion of the heat directed by the active element into the speaker cavity, and wherein the another mesh has a density that varies from a side facing the active element to an opposite side facing the thermally conductive mesh.

2. A speaker apparatus according to claim 1 wherein the active element comprises a fan configured to direct air into the speaker cavity.

3. A speaker apparatus according to claim 2 wherein the another mesh comprises a graded mesh that is in thermal communication with the component that generates heat and is positioned between the fan and the thermally conductive mesh.

4. A speaker apparatus according to claim 3 wherein the density of the graded mesh is graded so as to increase from the side facing the fan to the opposite side facing the thermally conductive mesh.

5. A speaker apparatus according to claim 1 wherein the heat dissipation structure further comprises a flow loop extending between a first section in thermal communication with the component that generates heat and a second section disposed within the thermally conductive mesh, and wherein the active element comprises a pump configured to pump liquid through the flow loop.

6. A speaker apparatus according to claim 5 wherein the flow loop comprises a serpentine section within the thermally conductive mesh.

7. A speaker apparatus comprising:
a speaker;
a speaker cavity configured to receive sound waves emitted by the speaker for propagation through the speaker cavity; and
a heat dissipation structure disposed at least partially within the speaker cavity, wherein the heat dissipation structure comprises a thermally conductive mesh that at least partially fills the speaker cavity, and wherein the heat dissipation structure further comprises a fan configured to force air to direct heat generated by a component into the thermally conductive mesh for dissipation therein, and wherein the thermally conductive mesh is configured to provide acoustic absorption for the sound waves propagating through the speaker cavity,
wherein the heat dissipation structure further comprises another mesh and a plurality of thermally conductive rigid elements disposed within the another mesh, wherein the another mesh is positioned between the fan and the thermally conductive mesh so as to redirect at least a portion of the heat directed by the active element into the speaker cavity, and wherein the another mesh has a density that varies from a side facing the fan to an opposite side facing the thermally conductive mesh.

8. A speaker apparatus according to claim 7 wherein the another mesh comprises a graded mesh that is in thermal communication with the component that generates heat.

9. A speaker apparatus according to claim 8 wherein the density of the graded mesh is graded so as to increase from the side facing the fan to the opposite side facing the thermally conductive mesh.

10. A speaker apparatus according to claim 8 wherein the heat dissipation structure further comprises a thermal interface material between the graded mesh and the component that generates heat.

11. A speaker apparatus according to claim 7 wherein the thermally conductive mesh is formed of a plurality of layers of an additively manufactured metal.

12. A speaker apparatus comprising:
a speaker;
a speaker cavity configured to receive sound waves emitted by the speaker for propagation through the speaker cavity; and
a heat dissipation structure disposed at least partially within the speaker cavity, wherein the heat dissipation structure comprises a thermally conductive mesh that at least partially fills the speaker cavity, a flow loop extending between a first serpentine section having a plurality of loops in thermal communication with a component that generates heat and a second serpentine section having a second plurality of loops disposed within the thermally conductive mesh, and a pump configured to pump liquid through the flow loop in order to dissipate heat generated by the component into the thermally conductive mesh, and wherein the thermally conductive mesh is configured to provide acoustic absorption for the sound waves propagating through the speaker cavity,
wherein the second serpentine section of the flow loop is disposed within the thermally conductive mesh and is configured such that heat carried by the liquid circulating through the flow loop is dissipated into the thermally conductive mesh.

13. A speaker apparatus according to claim 12 wherein the flow loop defines a first flow loop to dissipate heat generated by a first component, and wherein the heat dissipation structure further comprises a second flow loop extending between a first section in thermal communication with a second component that generates heat and a second section disposed within the thermally conductive mesh in order to dissipate heat generated by the second component into the thermally conductive mesh.

14. A speaker apparatus according to claim 13 wherein the heat dissipation structure comprising the first and second flow loops is configured to maintain the first and second components within different operating temperature constraints.

15. A speaker apparatus according to claim 12 wherein the thermally conductive mesh is formed of a plurality of layers of an additively manufactured metal.

16. A speaker apparatus according to claim 15 wherein the additively manufactured metal comprises aluminum.

* * * * *